(12) United States Patent
Sano et al.

(10) Patent No.: US 10,840,463 B2
(45) Date of Patent: Nov. 17, 2020

(54) DISPLAY DEVICE

(71) Applicant: Japan Display Inc., Minato-ku (JP)

(72) Inventors: Takumi Sano, Tokyo (JP); Yasushi Kawata, Tokyo (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/902,016

(22) Filed: Feb. 22, 2018

(65) Prior Publication Data

US 2018/0248140 A1    Aug. 30, 2018

(30) Foreign Application Priority Data

Feb. 24, 2017   (JP) ................................. 2017-033427

(51) Int. Cl.
| | |
|---|---|
| *H01L 51/00* | (2006.01) |
| *H01L 51/52* | (2006.01) |
| *H01L 51/56* | (2006.01) |
| *B32B 27/36* | (2006.01) |
| *B32B 27/08* | (2006.01) |
| *H01L 27/32* | (2006.01) |

(52) U.S. Cl.
CPC .......... *H01L 51/0097* (2013.01); *B32B 27/08* (2013.01); *B32B 27/36* (2013.01); *H01L 51/5246* (2013.01); *H01L 51/56* (2013.01); *B32B 2457/206* (2013.01); *H01L 27/3211* (2013.01); *H01L 27/3276* (2013.01); *H01L 51/5253* (2013.01); *H01L 2251/5338* (2013.01); *Y02E 10/549* (2013.01)

(58) Field of Classification Search
CPC .................................................. H01L 51/0097
USPC ........................................................... 257/88
See application file for complete search history.

(56) References Cited

U.S. PATENT DOCUMENTS

| | | | |
|---|---|---|---|
| 2012/0146886 A1 | 6/2012 | Minami et al. | |
| 2014/0353670 A1 | 12/2014 | Youn et al. | |
| 2015/0287750 A1 | 10/2015 | Youn et al. | |
| 2017/0155066 A1 | 6/2017 | Minami et al. | |
| 2017/0179423 A1* | 6/2017 | Kwon | ................... H01L 27/323 |
| 2017/0294621 A1* | 10/2017 | Higano | ............... H01L 51/5253 |
| 2017/0331059 A1 | 11/2017 | Minami et al. | |

FOREIGN PATENT DOCUMENTS

| | | |
|---|---|---|
| JP | 2012-128006 | 7/2012 |
| JP | 2014-232300 | 12/2014 |

* cited by examiner

*Primary Examiner* — Hsin Yi Hsieh
(74) *Attorney, Agent, or Firm* — Oblon, McClelland, Maier & Neustadt, L.L.P.

(57) ABSTRACT

According to one embodiment, a display device includes an insulating substrate including a first main surface, a first supporting substrate adhered to the first main surface of the insulating substrate, and a second supporting substrate spaced from the first supporting substrate and adhered to the first main surface of the insulating substrate, and the first supporting substrate includes a first side surface opposing the second supporting substrate, the second supporting substrate includes a second side surface opposing the first supporting substrate, the first supporting substrate is formed into a tapered shape which narrows toward the first side surface, and the second supporting substrate is formed into a tapered shape which narrows toward the second side surface.

12 Claims, 8 Drawing Sheets

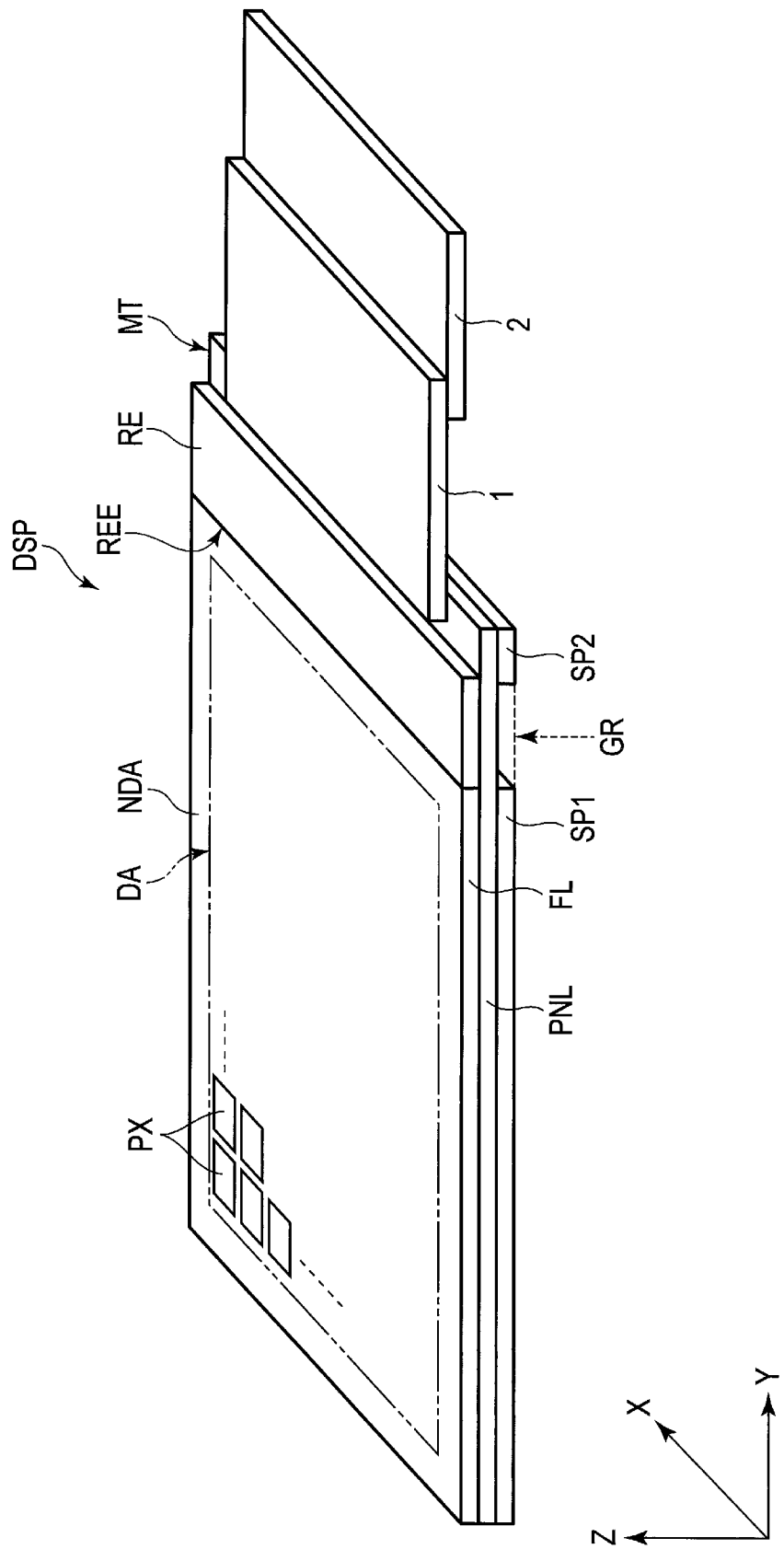
F I G. 1

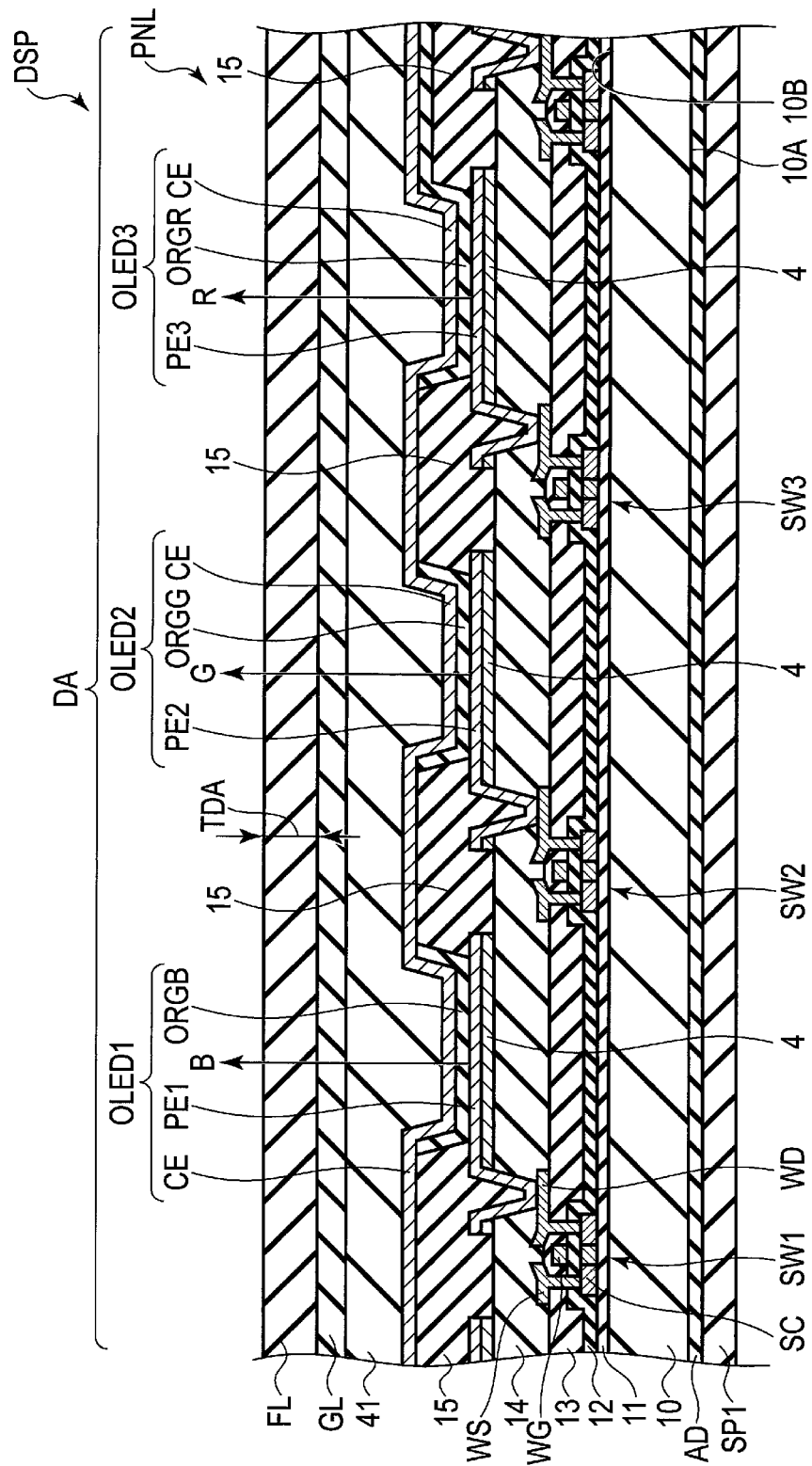
F I G. 2

DISPLAY DEVICE

CROSS-REFERENCE TO RELATED APPLICATIONS

This application is based upon and claims the benefit of priority from Japanese Patent Application No. 2017-033427, filed Feb. 24, 2017, the entire contents of which are incorporated herein by reference.

FIELD

Embodiments described herein relate generally to a display device.

BACKGROUND

Conventionally, in a display device such as an organic electroluminescent display device or a liquid crystal display device, a glass substrate is used as the base of a display panel. Moreover, in recent years, a flexible type display device has been developed, in which the display panel is formed flexible by using a resin substrate such as polyimide as its substrate.

Such a display device comprises pads connected to external circuits in a non-display area surrounding the display area, to which voltage is supplied so as to supply voltage to each pixel, wiring lines connected to the pads, etc. Further, in order to narrow the frame of the display device, the display device is accommodated in an electronic device or the like while the substrate thereof is bent to dispose the pads on a back of the substrate.

BRIEF DESCRIPTION OF THE DRAWINGS

FIG. 1 is a perspective view showing the structure of a display device according to an embodiment.

FIG. 2 is a cross-sectional view of a display area of the display device shown in FIG. 1.

DETAILED DESCRIPTION

Figure 3:
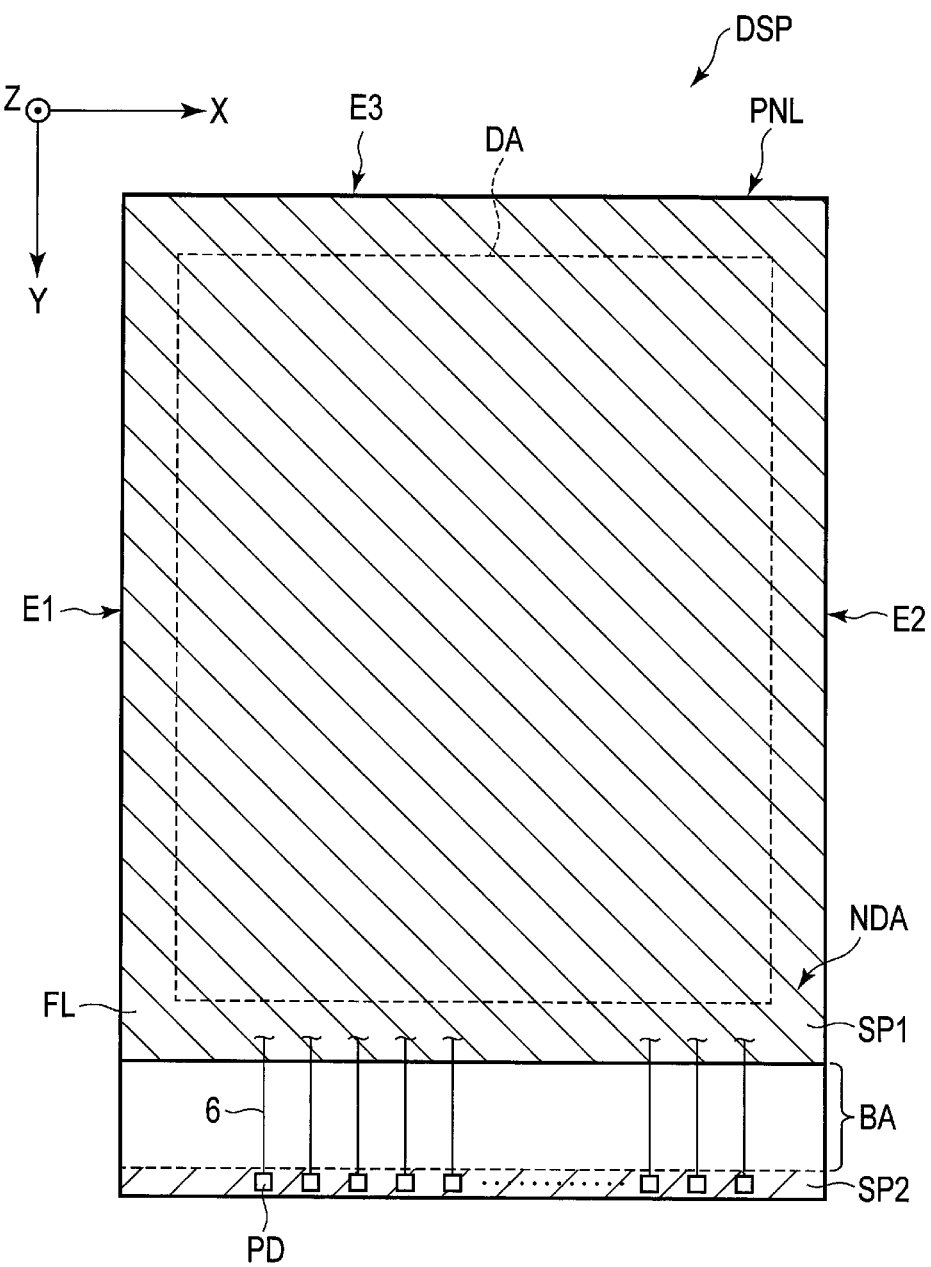
FIG. 3 is a plan view of a display panel according to this embodiment, illustrating positions of a first supporting substrate and a second supporting substrate with relative to each other.

In general, according to one embodiment, a display device comprises an insulating substrate comprising a first main surface, a first supporting substrate adhered to the first main surface of the insulating substrate and a second supporting substrate spaced from the first supporting substrate and adhered to the first main surface of the insulating substrate, wherein the first supporting substrate comprising a first side surface opposing the second supporting substrate, the second supporting substrate comprising a second side surface opposing the first supporting substrate, the first supporting substrate being formed into a tapered shape which narrows toward the first side surface, and the second supporting substrate being formed into a tapered shape which narrows toward the second side surface.

The embodiment will be described hereinafter with reference to the accompanying drawings. Note that the disclosure is a mere example presented for the sake of exemplification, and any modification and variation conceived within the scope and spirit of the invention by a person having ordinary skill in the art are naturally encompassed in the scope of invention of the present application. Further, a width, thickness, shape, and the like of each element are depicted schematically in the figures as compared to actual embodiments for the sake of simpler explanation, and they do not limit the interpretation of the invention of the present application. Furthermore, in the description and figures of the present application, structural elements having the same or similar functions will be referred to by the same reference numbers and detailed explanations of them that are considered redundant may be omitted.

First, a display device according to this embodiment will be described in detail.

FIG. 1 is a perspective view illustrating a configuration of a display device DSP according to the embodiment. FIG. 1 shows a three-dimensional space defined by a first axis X, a second axis Y orthogonal to the first axis X and a third axis Z orthogonal to the first axis X and the second axis Y. In the example illustrated, the first direction X, second direction Y and third direction Z orthogonally cross each other, but may cross each other at any angle other than an angle of 90 degrees. Hereafter, in this embodiment, the case where display device DSP is an organic electroluminescence display device will be described.

In this embodiment, a direction towards the tip of the arrow in the third direction Z is defined as "above" or simply "up", and a direction opposite to the direction towards the tip of the arrow in the third direction Z is defined as "below" or simply "down". Further, such expressions as "the second member above (or up on) the first member" and "the second member below (or down on) the first member", the second member may be in contact with the first member, or may be separated from the first member, or even the third member may be interposed between the first member and the second member.

As shown in FIG. 1, the display device DSP comprises a display panel PNL, a film FL, a wiring substrate 1, a flexible printed circuit 2, a first supporting substrate SP1, a second supporting substrate SP2, a resin layer RE and the like.

The display panel PNL includes a display area DA which displays images and a non-display area NDA surrounding the display area DA. The display panel PNL includes a plurality of pixels PX in the display area DA. The pixels PX are arranged in a matrix along the first direction X and the second direction Y.

The film FL is disposed on the display panel PNL. In the example illustrated, three side edges of the film FL are aligned with respective three side edges of the display panel PNL along the third direction Z. Here, a side edge of the film FL, which is parallel to the first direction X and a side edge of the display panel PNL, which is parallel to the first direction X, have substantially the same length. Here, a side edge of the film FL, which is parallel to the second direction Y has a length shorter than a side edge of the display panel PNL, which is parallel to the second direction Y. That is, in the X-Y plane defined by the first direction X and the second direction Y, the area of the film FL is less than that of the display panel PNL.

The display panel PNL comprises a mounting portion MT extending to an outside of the region overlapping the film FL. In the example illustrated, the wiring substrate 1 is mounted above the mounting portion MT in the non-display area NDA. In the example illustrated, the length of the side edge of the wiring substrate 1, which is parallel to the first direction X is less than that of the side edge of the display panel PNL, which is parallel to the first direction X, but they may be substantially the same. The display panel PNL and the wiring substrate 1 are electrically connected to each other. The flexible wiring substrate 2 is disposed below the wiring substrate 1, and is electrically connected to the wiring substrate 1. The flexible wiring substrate 2 overlaps an side of the wiring substrate 1, opposite to the side edge overlapping the display panel PNL. Note that the flexible wiring substrate 2 may be disposed above the wiring substrate 1.

The first supporting substrate SP1 and the second supporting substrate SP2 are adhered below the display panel PNL. The first supporting substrate SP1 and the second supporting substrate SP2 are spaced from each other. The first supporting substrate SP1 overlaps the display area DA along the third direction Z. The second supporting substrate SP2 overlaps the non-display area NDA and the mounting portion MT along the third direction Z. The display device DSP comprises a groove portion GR between the first supporting substrate SP1 and the second supporting substrate SP2.

The resin layer RE is disposed above the mounting portion MT. The resin layer RE is disposed in a position overlapping the groove portion GR along the third direction Z. Further, as will be described later, an end REE of the resin layer RE, on a film FL side overlaps the film FL along the third direction Z.

FIG. 2 is a cross-sectional view of a display area DA of the display device DSP shown in FIG. 1.

As shown in FIG. 2, the display panel PNL comprises an insulating substrate 10, switching elements SW1, SW2 and SW3, a reflective layer 4, organic EL devices OLED1, OLED2 and OLED3, a sealing layer 41, a first supporting substrate SP1, an adhesive layer GL, a film FL, etc.

The insulating substrate 10 is formed from an organic insulating material, for example, polyimide. The insulating substrate 10 comprises a main surface 10A and a main surface 10B on an opposite side to the main surface 10A. The insulating substrate 10 is covered by the first insulating film 11.

The switching elements SW1, SW2 and SW3 are formed above the first insulating film 11. In the example illustrated, the switching elements SW1, SW2 and SW3 are formed from top-gated thin film transistors, but they may be bottom-gate thin film transistors. Since the switching elements SW1, SW2, and SW3 are of the identical configurations, the structure thereof will be described in more detail hereafter while focusing on the switching element SW1. The switching element SW1 comprises a semiconductor layer SC formed on the first insulating film 11. The semiconductor layer SC is covered by the second insulating film 12. Moreover, the second insulating film 12 is disposed also on the first insulating film 11.

A gate electrode WG of the switching element SW1 is formed on the second insulating film 12 and is located immediately above the semiconductor layer SC.

The gate electrode WG is covered by the third insulating film 13. Further, the third insulating film 13 is disposed also on the second insulating film 12.

The first insulating film 11, second insulating film 12, and third insulating film 13 are each formed of an inorganic material such as silicon oxide or silicon nitride.

A source electrode WS and a drain electrode WD of the switching element SW1 are formed on the third insulating film 13. The source electrode WS and the drain electrode WD are electrically connected to the semiconductor layer SC via contact holes penetrating the second insulating film 12 and the third insulating film 13, respectively. The switching element SW is covered by the fourth insulating film 14. The fourth insulating film 14 is disposed also on the third insulating film 13. The fourth insulating film 14 is formed of, for example, an organic material such as transparent resin.

The reflective layer 4 is formed on the fourth insulating film 14. The reflective layer 4 is formed of a highly reflective metal material such as aluminum or silver. Note that the upper surface of the reflective layer 4 may be flat, or irregular in which case a light-scattering property can imparted.

The organic EL devices OLED1 to OLED3 are formed on the fourth insulating film 14. That is, the organic EL devices OLED1 to OLED3 are located between the insulating substrate 10 and the film FL. In the example illustrated, the organic EL device OLED1 is electrically connected to the switching element SW1, the organic EL device OLED2 is electrically connected to the switching element SW2 and the organic EL device OLED3 is electrically connected to the switching element SW3. The organic EL devices OLED1 to OLED3 each are of a top emission type, which emits red light, blue light and green light toward a side of the film FL. The organic EL devices OLED1 to OLED3 have the identical structure. In the example illustrated, the organic EL devices OLED1 to OLED3 are each partitioned by a rib 15.

The organic EL device OLED1 comprises a pixel electrode PE1 formed on the reflective layer 4. The pixel electrode PE1 is brought into contact with the drain electrode WD of the switching element SW1 and is electrically connected to the switching element SW1. Similarly, the organic EL device OLED2 comprises a pixel electrode PE2 electrically connected to the switching element SW2, and the organic EL device OLED3 comprises a pixel electrode PE3 electrically connected to the switching element SW3. The pixel electrodes PE1, PE2 and PE3 are each formed of, for example, a transparent conductive material such as indium tin oxide (ITO) or indium zinc oxide (IZO).

For example, the organic EL device OLED1 comprises an organic light-emitting layer ORGB which emits blue light, the organic EL device OLED2 comprises an organic light-emitting layer ORGG which emits green light, and the organic EL device OLED3 comprises an organic light-emitting layer ORGR which emits red light. The organic light-emitting layer ORGB is located on a positive electrode PE1, the organic light-emitting layer ORGG is located on a positive electrode PE2, and the organic light-emitting layer ORGR is located on a positive electrode PE3. Further, the organic EL devices OLED1 to OLED3 share a common electrode CE. The common electrode CE is located on the organic light-emitting layers ORGB, ORGG and ORGR. The common electrode CE is located also on the rib 15. Of the pixel electrodes PE and the common electrode CE, one side is a positive electrode and the other side is a negative electrode. The common electrode CE is formed of, for example, a transparent conductive material such as ITO or IZO.

The sealing layer 41 covers over the organic EL devices OLED1, OLED2 and OLED3. The sealing layer 41 seals the members disposed between the insulating substrate 10 and itself. The sealing layer 41 inhibit entering of oxygen and moisture to the organic EL device OLED1, OLED2, and OLED3, so as to prevent degradation of the organic EL device OLED1, OLED2 and OLED3. Note that the sealing layer 41 may be formed from a stacked layer body of an inorganic film and an organic layer.

The film FL is located above the sealing layer 41, and is adhered to the sealing layer 41 using the adhesive layer GL. That is, the film FL is disposed on a main surface 10B side of the insulating substrate 10. The film FL is, for example, a protection film, an optical film or the like, formed from a transparent material. In the example illustrated, the film FL has a thickness TDA at a position overlapping the display area DA. The adhesive layer GL is formed from, for example, any of an acrylic material, epoxy material and polyimide.

The first supporting substrate SP1 is adhered to on the insulating substrate 10 on an opposite side to the film FL of the insulating substrate 10. That is, the first supporting substrate SP1 is disposed on the main surface 10A side of the insulating substrate 10. The first supporting substrate SP1 is adhered to the insulating substrate 10 with an adhesive AD. As the material of the first supporting substrate SP1, for example, a material excellent in heat resistance, gas checking property, moisture prevention and mechanical strength, and also inexpensive is preferable. The first supporting substrate SP1 has a heat resistance, for example, to such a degree which it does not denature or deform with the process temperature during the process of manufacturing the display device DSP. Further, the first supporting substrate SP1 has a mechanical strength greater than, for example, that of the insulating substrate 10 and functions as a supporting layer which inhibits such a matter that the display panel PNL curves even while no stress is applied from outside. Further, the first supporting substrate SP1 has, for example, moisture prevention for inhibiting the entering of moisture and the like into the insulating substrate 10 and gas-checking property for inhibiting the entering of gas, and it functions as a barrier layer. The first supporting substrate SP1 is a film formed, for example, from polyethylene terephthalate. Although not illustrated, the second supporting substrate SP2 has a function similar to that of the first supporting substrate SP1 and is formed from the same material as that of the first supporting substrate SP1.

In the display device DSP having such a structure, when the organic EL devices OLED1 to OLED3 emits light, the organic EL device OLED1 emits blue light, the organic EL device OLED2 emits green light, and the organic EL device OLED3 emits red light. Thus, the color presentation of the display device DSP is realized.

The pixels PX shown in FIG. 1 are each a minimum unit which constitutes a color image, for example, and comprises the organic EL devices OLED1 to OLED3 described above.

In the configuration example described above, the organic EL devices OLED1 to OLED3 respectively comprise the organic light-emitting layer ORGB which emits blue light, the organic light-emitting layer ORGR which emits red light and the organic light-emitting layer ORGG which emits green light, but the configuration is not limited to this. The organic EL devices OLED1 to OLED3 may comprise a common organic light-emitting layer. In this case, the organic EL devices OLED1 to OLED3 emit white light, for example. In such a configuration example, a color filter layer is disposed above the sealing layer 41.

FIG. 3 is a plan view showing the display panel PNL according to this embodiment, and illustrates the positions of the first supporting substrate SP1, the second supporting substrate SP2 and the like, with relative to each other.

In FIG. 3, the first supporting substrate SP1 is indicated by downward sloping lines.

The first supporting substrate SP1 overlaps the display area DA in plan view. Further, the first supporting substrate SP1 overlaps the film FL in plan view. The second supporting substrate SP2 is indicated by upward sloping lines. The second supporting substrate SP2 extends along the first direction X.

In this embodiment, the display device DSP comprises a bend area BA to be bent when accommodated in a housing such as of an electronic device. To explain, the bend area BA is bent so that the wiring substrate 1 and the flexible wiring substrate 2 shown in FIG. 1 are disposed below the display area DA. The bend area BA is located between the first supporting substrate SP1 and the second supporting substrate SP2 in plan view. That is, in plan view, the bend area BA is located in a region where the groove portion GR is formed. Further, the bend area BA is located within the non-display area NDA.

The display panel PNL comprises a plurality of pad electrodes PD for externally connecting to electrical circuits. The pad electrodes PD, in plan view, overlap the second supporting substrate SP2, and are arranged along with the first direction X. A plurality of signal wiring lines 6 are connected to the pad electrodes PD, respectively, and are arranged along the first direction X to extend along the second direction Y in the bend area BA.

Moreover, the display panel PNL comprises end portions E1, E2 and E3 corresponding respectively to cut lines CL1, CL2 and CL3, which will be described later. The end portions E1 and E2 corresponding to the cut lines CL1 and CL2 extend along the second direction. The end E3 corresponding to the cut line CL3 extends along the first direction X.

Next, a part of a method of manufacturing the display device according to this embodiment will be described in detail.

Figure 4:
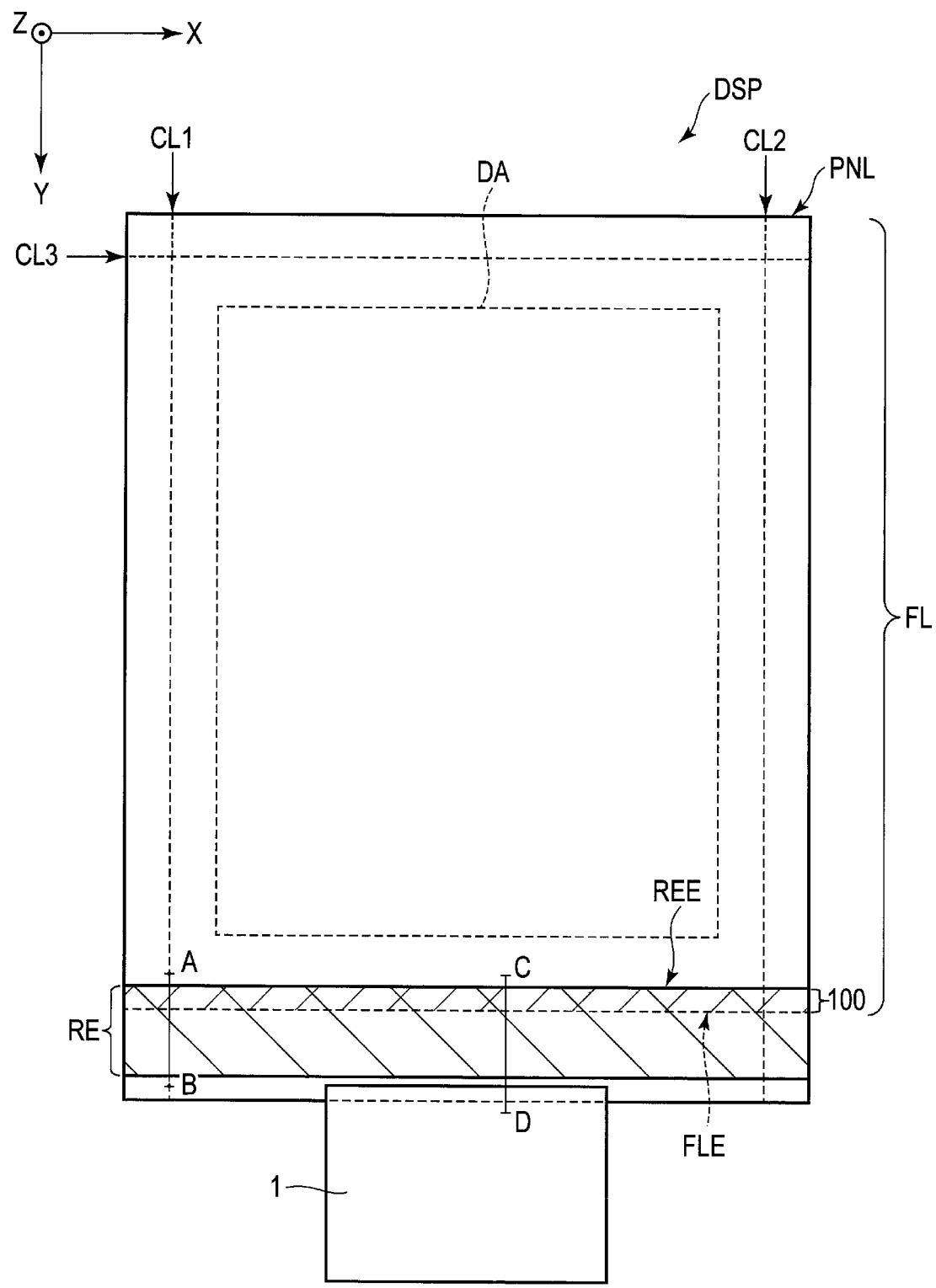
FIG. 4 is a plan view illustrating a step in a method of manufacturing the display device of the embodiment.
Figure 5:
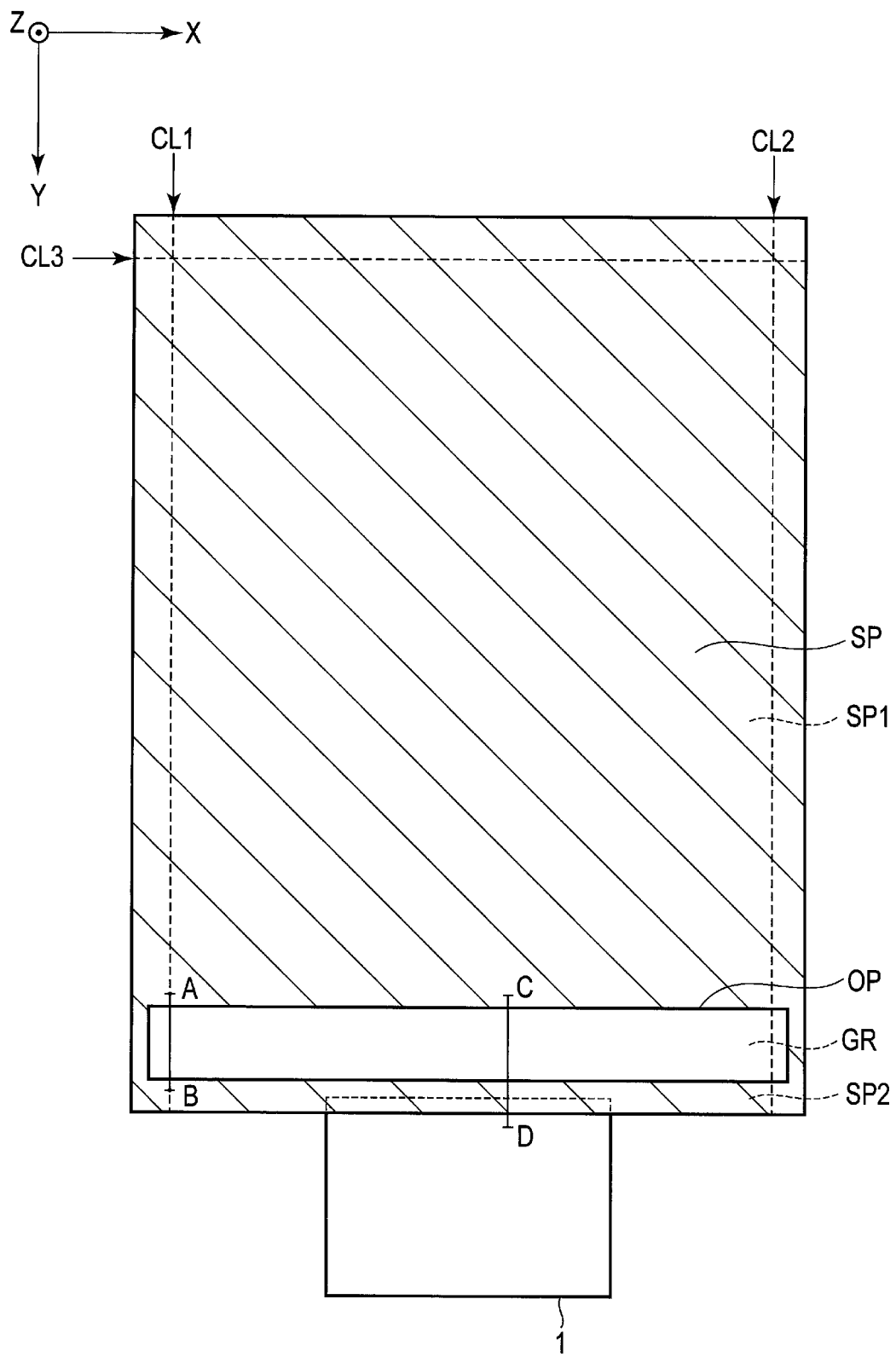
FIG. 5 is a plan view illustrating a step in the method of manufacturing the display device of the embodiment.

FIGS. 4 and 5 are plan views each illustrating a step in the method of manufacturing the display device of the embodiment. FIGS. 4 and 5 each show a step of shaping the outline of the display panel PNL.

First, as shown in FIG. 4, a display device DSP is prepared. The film FL overlaps the display area DA in plan view. The resin layer RE is disposed in the region indicated by upward sloping lines. The resin layer RE extends along the first direction X. Here, an end FLE of the film FL on a wiring substrate 1 side overlaps the resin layer RE in plan view. That is, the film FL a superposing portion 100 which overlaps the resin layer RE. The superposing portion 100 is located in the region indicated by upward sloping lines. In the example illustrated, the superposing portion 100 extends along the first direction X. Further, an end REE of the resin layer RE on a display area DA side overlaps the film FL in plan view.

Next, the display panel PNL is cut along the cut lines CL1, CL2 and CL3. The cut lines CL1 and CL2 extend along the second direction Y, and overlap the film FL and the resin layer RE. The cut line CL3 extends along the first direction X, and overlaps the film FL.

Here, as shown in FIG. 5, a motherboard SP which gives rise to the first supporting substrate SP1 and the second supporting substrate SP2 is placed. The mother board SP comprises an opening OP. The opening OP extends along the first direction X. The cut lines CL1, CL2 and CL3 overlap the motherboard SP. Further, the cut lines CL1 and CL2 overlap the opening OP. That is, the first supporting substrate SP1 and the second supporting substrate SP2 are formed by cutting the display panel PNL along the cut lines CL1 and CL2. Further, the groove portion GR is formed by cutting the display panel PNL along the cut lines CL1 and CL2.

In the example shown in FIGS. 4 and 5, the intersection of the cut lines CL1 and CL3 and the intersection of the cut lines CL2 and CL3 cross approximately at right angle, but they may be formed in a round shape.

Figure 6:
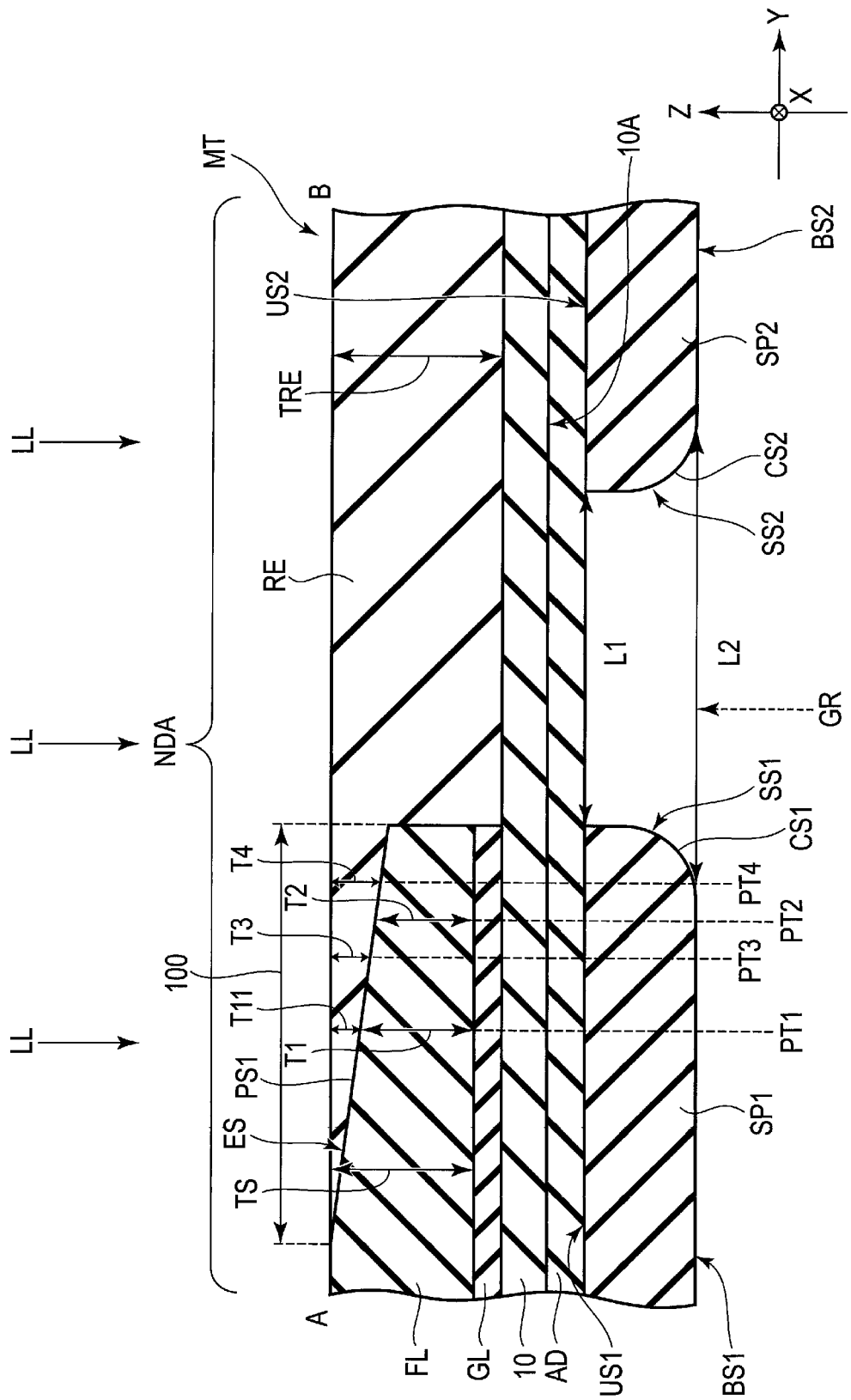
FIG. 6 is a cross-sectional view of the display panel taken along line A-B shown in FIGS. 4 and 5.

FIG. 6 is a cross-sectional view of the display panel taken along line A-B shown in FIGS. 4 and 5. The line A-B is located on the cut line CL1.

The first supporting substrate SP1 is adhered to the main surface 10A. The first supporting substrate SP1 comprises a first A side US1 and a first B side BS1 on an opposite side to the first A side US1. The first A side US1 is adhered to the main surface 10A with the adhesive AD. The first supporting substrate SP1 comprises a first side surface SS1 opposing the second supporting substrate SP2 along the second direction Y. The first side surface SS1 includes a curved surface CS1 and inclines to an X-Z plane. The second supporting substrate SP2 is spaced from the first supporting substrate SP1 and adhered to the main surface 10A. The second supporting substrate SP2 comprises a second A side US2 and a second B side BS2 on an opposite side to the second A side US2. The second A side US2 is adhered to the main surface 10A with the adhesive AD. The second supporting substrate SP2 comprises a first supporting substrate SP1 opposing the second side surface SS2 along the second direction Y. The second side surface SS2 includes a curved surface CS2 and inclines to the X-Z plane. That is, the first supporting substrate SP1 is formed in a tapered shape in which the thickness decreases gradually toward the first side surface SS1, and the second supporting substrate SP2 is formed in a tapered shape in which the thickness decreases toward the second side surface SS2.

Further, the display panel PNL comprises the groove portion GR between the first supporting substrate SP1 and the second supporting substrate SP2. The groove portion GR comprises a first interval L1 between the first A side US1 and the second A side US2, and a second interval L2 between the first B side BS1 and the second B side BS2. While the display panel PNL is not bent, the first interval L1 is less than the second interval L2. In this embodiment, the first supporting substrate SP1 and the second supporting substrate SP2 are each formed of polyethylene terephthalate.

The film FL is located on a side of the insulating substrate 10, opposite to the first supporting substrate SP1. The film FL comprises an edge surface ES in contact with the resin layer RE. In the example illustrated, the edge surface ES includes an inclined surface PS1 inclined with respect to an X-Z plane. Further, the resin layer RE is located on a side of the insulating substrate 10, opposite to the second supporting substrate SP2. The film FL comprises a superposing portion 100 which overlaps the resin layer RE. The film FL has, in the superposing portion 100, a first thickness T1 at a first position PT1 and a second thickness T2 at a second position PT2 which is on a mounting portion MT side with respect to the first position PT1. The first thickness T1 is greater than the second thickness T2.

The resin layer RE has, a region which overlaps the superposing portion 100, a third thickness T3 at a third position PT3 and a fourth thickness T4 at a fourth position PT4 on a mounting portion MT side with respect to the third position PT3. The third thickness T3 is less than the fourth thickness T4.

Here, as shown in FIG. 2, the film FL has a thickness TDA at a position which overlaps the display area DA. Further, the resin layer RE has a thickness TRE at a position which overlaps the second supporting substrate SP2. The thickness TDA is approximately equal to the thickness TRE. More specifically, a total of the thickness TDA and the thickness of the adhesive layer GL is equal to the thickness TRE. Here, the adhesive layer GL has such a thickness that needs not be considered as compared to the thickness TDA.

When the total of the thickness of the film FL and that of the resin layer RE is defined as a thickness TS, the thickness TS is no greater than the thickness TDA at a position which overlaps the display area DA of the film FL at a position which overlaps the superposing portion 100. Further, at the position which overlaps the superposing portion 100, the thickness of the resin layer RE is less than that of the film FL. For example, when the thickness of the resin layer RE at the first position PT1 is defined as a thickness T11, the thickness T11 is less than the first thickness T1.

Here, the display panel PNL is cut by irradiating laser beam LL from above the display panel PNL onto the cut lines CL1, CL2, and CL3 shown in FIGS. 4 and 5. For example, the laser beam LL is irradiated while moving from the point A toward the point B in FIG. 6. The laser beam LL is, for example, $CO_2$ laser and has a wavelength of 308 nm or less.

Let us now focus on the structure above the insulating substrate 10. In this embodiment, the film FL and the resin layer RE have an equal light absorptivity for short wavelengths less than 350 nm. Thus, when having an equal thickness, the film FL and the resin layer RE are cut by laser beams LL of an equal output. That is, when the thickness TS is no greater than the thickness TDA or TRE, the film FL having the thickness TDA, the film FL and the resin layer RE each having the thickness TS and the resin layer RE having the thickness TRE can be cut with laser beams LL of an equal output. However, when the thickness TS is greater than the thickness TDA or the thickness TRE, a residual may be generated at the position which overlaps the superposing portion 100.

While the laser beam LL is moving from the point A to the point B, the thickness of the film FL becomes less gradually and the thickness of the resin layer RE becomes greater gradually in the superposing portion 100. In other words, the ratio between the refractivity of the film FL and that of the resin changes gradually with respect to the thickness TS. As described above, the resin layer RE is disposed to overlap the film FL, and with this structure, it is possible to prevent cracks from being created between the film FL and the resin layer RE or the film FL and the resin layer RE from being peeled off, which may occur when the display panel PNL is bent.

Let us now focus on the structure below the insulating substrate 10. When irradiating the laser beam LL while moving from the point A to the point B, the refractivity to the laser beam LL changes on a boundary between the first supporting substrate SP1 and the groove portion GR. Further, the refractivity to the laser beam LL changes on a boundary between the groove portion GR and the second supporting substrate SP2. In this embodiment, the first supporting substrate SP1 includes the curved surface CS1, and with this structure, the refractivity to the laser beam LL below the insulating substrate 10 gradually changes from the refractivity in the first supporting substrate SP1 to the refractivity in the groove portion GR. Similarly, in this embodiment, the first supporting substrate SP2 includes the curved surface CS2, and with this structure, the refractivity to the laser beam LL below the insulating substrate 10 gradually changes from the refractivity in the groove portion GR to the refractivity in the second supporting substrate SP2. Note that the laser beam LL may be irradiated while moving from the point B toward the point A.

According to this embodiment, the first supporting substrate SP1 and the second supporting substrate SP2 are arranged to be spaced from each other and the display device DSP comprises the groove portion GR between the first supporting substrate SP1 and the second supporting substrate SP2. Further, the first interval L1 between the first A side US1 and the second A side US2 in the groove portion GR is less than the second interval L2 between the first B side BS1 and the second B side BS2 in the groove portion GR. With this configuration, diffusion of the laser beam LL in the first side surface SS1 and the second side surface SS2 can be suppressed as compared to the case where the first interval L1 and the second interval L2 are equal to each other, that is, the first side surface SS1 and the second side surface SS2 are parallel to an X-Z plane. Thus, the occurrence of the residual, which may be caused by the diffusion of the laser beam LL, can be suppressed.

Moreover, according to this embodiment, the first thickness T1 is greater than the second thickness T2. That is, the edge surface ES is inclined and the resin layer RE is disposed also on the superposing portion 100 of the film FL. In this case as well, the thickness TS is no greater than the thickness TDA or the thickness TRE. Therefore, it is possible to cut the film FL and the resin layer RE with a laser beam LL of an output equivalent to that for cutting the film of the thickness TDA and the resin layer RE of the thickness TRE also at the position which overlaps the superposing portion 100. Thus, the occurrence of a residual at the position which overlaps the superposing portion 100 can be suppressed. Consequently, it is possible to suppress the decrease of the yield, which may be caused by a cut error in the insulating substrate 10 due to the occurrence of the residual.

Note that FIG. 6 shows the structure of the display panel PNL on the cut line CL1, and the display panel PNL has a structure similar thereto on the cut line CL2 as well. Further, it suffices only if the relationship between the film FL and the resin layer RE in the superposing portion 100 shown in FIG. 6, and the structure relating to this embodiment, such as of the first side surface SS1 of the first supporting substrate SP1 and the second side surface SS2 of the second supporting substrate SP2 are applied on the cut lines CL1 and CL2, and may not necessarily be applied in the other positions. In other words, in the superposing portion 100 between the cut lines CL1 and CL2, some other structure may be constituted, different from that of this embodiment, specifically, the relationship between the film FL and the resin layer RE, the first side surface SS1 of the first supporting substrate SP1 and the second side surface SS2 of the second supporting substrate SP2 or the like.

Next, an example of the display device according to this embodiment will be described in detail.

Figure 7:
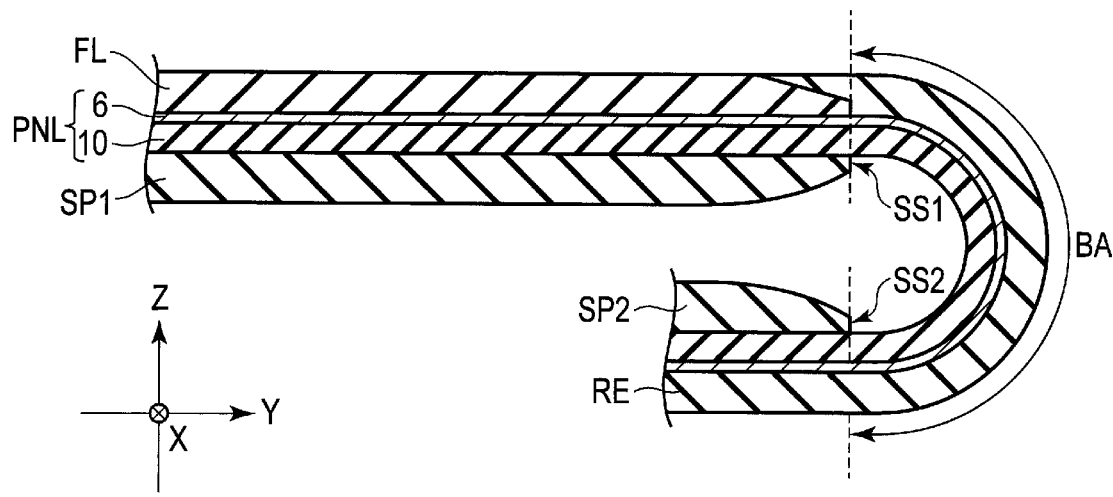
FIG. 7 is a cross section showing the state after bending a bending region of the display panel shown in FIG. 3.

FIG. 7 is a cross section showing the bend area BA of the display panel PNL shown in FIG. 3, which is bent.

The first supporting substrate SP1 is formed into a tapered shape which narrows toward the first side surface SS1. The second supporting substrate SP2 is formed into a tapered shape which narrows toward the second side surface SS2.

The bend area BA is bent such that the first supporting substrate SP1 and the second supporting substrate SP2 oppose each other along the third direction Z. The resin layer RE is located in the bend area BA. In the example illustrated, the insulating substrate 10, the signal wiring line 6 and the resin layer RE are bent in the bend area BA.

Here, in the bend area BA, tensile stress and compressive stress are created in the display panel PNL. When such tensile stress or compressive stress is applied to the signal wiring line 6, the signal wiring line 6 may be undesirably broken. In this embodiment, the resin layer RE is disposed in the bend region BA. With this structure, the signal wiring line 6 located in the bend area BA can be located to the neutral surface or its vicinity, where the compressive stress and tensile stress are both zero. In this manner, the breaking of the signal wiring line 6 can be suppressed.

In order to maintain the curvature of bending, a support part may be disposed between the first supporting substrate SP1 and the second supporting substrate SP2. In this case, the support member is attached to the first supporting substrate SP1 with the adhesive provided between the first supporting substrate SP1 and the support member. Further, the support member is attached to the second supporting substrate SP2 with the adhesive provided between the second supporting substrate SP2 and the support member. Note that a backlight unit may be provided in place of the support member.

Figure 8:
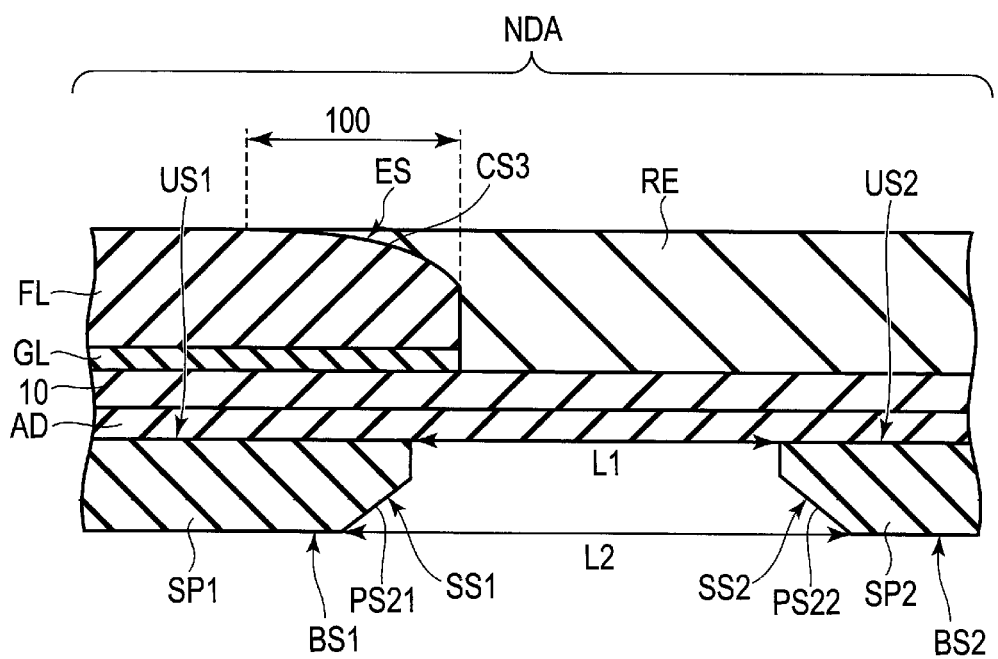
FIG. 8 is a cross-sectional view of the display panel taken along line A-B shown in FIGS. 4 and 5.

FIG. 8 is a cross-sectional view of another example of the display panel taken along line A-B shown in FIGS. 4 and 5. The structure shown in FIG. 8 is different from that FIG. 6 mainly in that the edge surface ES of the film FL includes a curved surface CS3.

In the example illustrated, the first side surface SS1 includes an inclined surface PS21. The second side surface SS2 includes an inclined surface PS22. In the embodiment shown in FIG. 8 as well, the first interval L1 is less than the second interval L2 as in the embodiment described above.

In such a configuration, an advantageous effect similar to that described above can be obtained.

Figure 9:
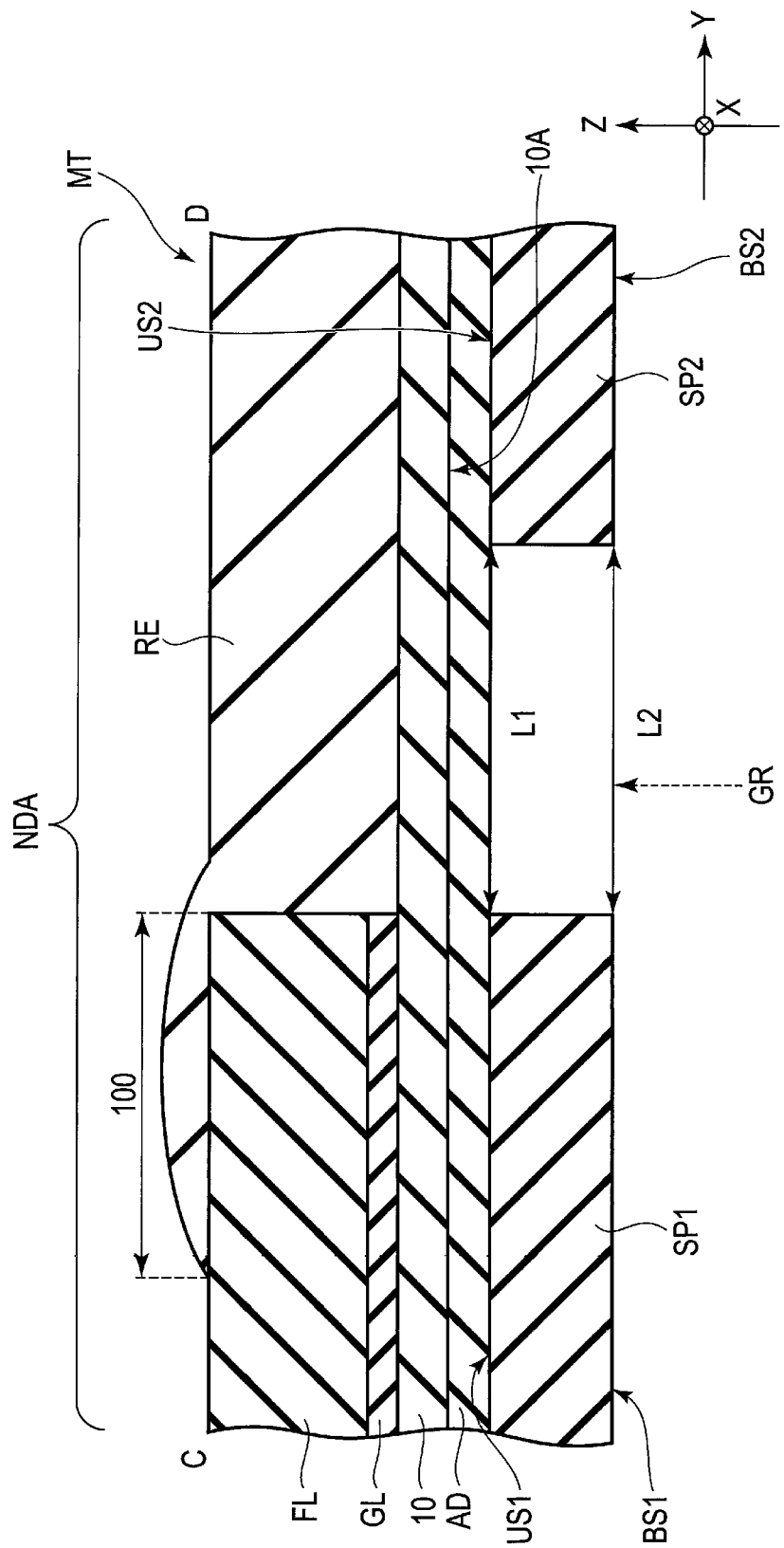
FIG. 9 is a cross-sectional view of the display panel taken along line C-D shown in FIGS. 4 and 5.

FIG. 9 is a cross-sectional view of the display panel taken along line C-D shown in FIGS. 4 and 5. The line C-D is located in a place different from those of the cut lines CL1 and CL2.

The thickness of the film FL is equal to the thickness TDA in the display area DA also in the superposing portion 100. Further, the first side surface SS1 and the second side surface SS2 are parallel to the X-Z plane, and the first interval L1 and the second interval L2 are equal to each other. Thus, the configuration example may have a structure different from that shown in FIG. 6 except for those on the cut lines CL1 and CL2.

As described above, according to the embodiment, a display device which can suppress the decrease of the yield in the manufacture can be obtained.

In addition, the above-described embodiment can be applied not only to organic electroluminescence display devices but to liquid crystal displays. In that case, the display panel PNL is, for example, a liquid crystal display panel comprising a liquid crystal layer provided between the film FL and the insulating substrate 10. When the display panel PNL is a liquid crystal display panel, the liquid crystal display panel may be a reflective liquid crystal display panel which displays images by selectively reflecting light entering a film FL side, or a transmissive liquid crystal display panel which displays images by selectively transmitting light entering from an insulating substrate 10 side. Further, the main structure of this embodiment is substantially similar even when the display device DSP is a liquid crystal display.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device, comprising:
an insulating substrate comprising a first main surface;
a first supporting substrate adhered to the first main surface of the insulating substrate;
a second supporting substrate spaced from the first supporting substrate and adhered to the first main surface of the insulating substrate,
wherein
the first supporting substrate comprising a first side surface opposing the second supporting substrate,
the second supporting substrate comprising a second side surface opposing the first supporting substrate,
the first supporting substrate being formed into a tapered shape that narrows toward the first side surface, and
the second supporting substrate being formed into a tapered shape that narrows toward the second side surface;
a film located on a side of the insulating substrate that is an opposite side to the first main surface;
a resin layer located on a side of the insulating substrate that is an opposite side to the second supporting substrate; and
a mounting portion that overlaps the second supporting substrate,
wherein
the film comprises a superposing portion that overlaps the resin layer,
the film and the resin layer have an equal absorptivity for light of a short wavelength less than 350 nm, and
the superposing portion has a first thickness at a first position and a second thickness at a second position that is closer to the mounting portion than the first position, the first thickness being greater than the second thickness.

2. The device of claim 1, wherein
the first side surface and the second side surface each include a curved surface.

3. The device of claim 1, wherein
the resin layer has a third thickness at a third position that overlaps the superposing portion, and a fourth thickness at a fourth position that overlaps the superposing portion and is closer to the mounting portion than the third position, the third thickness being less than the fourth thickness.

4. The device of claim 1, wherein
a thickness of the film at a position that overlaps a display area is equal to or less than a thickness of the resin layer at a position that overlaps the second supporting substrate.

5. The device of claim 1, wherein
a total of the thickness of the film and the thickness of the resin layer at a position that overlaps the superposing portion is less than or equal to a thickness of the film at a position that overlaps the display area.

6. The device of claim 1, wherein
a thickness of the resin layer is less than a thickness of the film at a position that overlaps the superposing portion.

7. The device of claim 1, wherein
the film comprises an edge surface in contact with the resin layer, and
the edge surface includes a curved surface.

8. The device of claim 1, wherein
the film comprises an edge surface in contact with the resin layer, and
the edge surface includes an inclined surface.

9. The device of claim 1, further comprising:
a bend area to be bent between the first supporting substrate and the second supporting substrate.

10. The device of claim 1, wherein
the first supporting substrate and the second supporting substrate are each formed of polyethylene terephthalate.

11. The device of claim 1, wherein
the first supporting substrate comprises a first upper surface adhered to the first main surface of the insulating substrate, and a first lower surface on an opposite side to the first upper surface,
the second supporting substrate comprising a second upper surface adhered to the first main surface, and a second lower surface on an opposite side to the second upper surface, and
a distance between the first upper surface and the second upper surface is less than a distance between the first lower surface and the second lower surface.

12. The device of claim 9, wherein
the bend area overlaps the resin layer.

* * * * *